United States Patent
Kwon et al.

(10) Patent No.: US 10,386,404 B2
(45) Date of Patent: Aug. 20, 2019

(54) DEVICE AND METHOD FOR DETECTING DAMAGE OF ELECTRIC PRODUCT USING DIGITAL SIGNAL

(71) Applicant: UNIST (ULSAN NATIONAL INSTITUTE OF SCIENCE AND TECHNOLOGY), Ulsan (KR)

(72) Inventors: Daeil Kwon, Ulsan (KR); Jeong Ah Yoon, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 15/570,438

(22) PCT Filed: May 2, 2016

(86) PCT No.: PCT/KR2016/004596
§ 371 (c)(1),
(2) Date: Oct. 30, 2017

(87) PCT Pub. No.: WO2017/057815
PCT Pub. Date: Apr. 6, 2017

(65) Prior Publication Data
US 2018/0203055 A1 Jul. 19, 2018

(30) Foreign Application Priority Data

Sep. 30, 2015 (KR) .......................... 10-2015-0137907

(51) Int. Cl.
*G01R 31/04* (2006.01)
*G01R 31/304* (2006.01)
*G01R 31/28* (2006.01)

(52) U.S. Cl.
CPC .......... *G01R 31/048* (2013.01); *G01R 31/304* (2013.01); *G01R 31/2812* (2013.01)

(58) Field of Classification Search
CPC ....... H01L 21/00; H01L 2221/00; G01R 1/00; H05K 1/00; G06F 1/00; G06F 2101/00
See application file for complete search history.

(56) References Cited

U.S. PATENT DOCUMENTS

| | | | |
|---|---|---|---|
| 2003/0093730 A1* | 5/2003 | Halder | G01R 31/3167 714/724 |
| 2007/0024271 A1* | 2/2007 | Azimi | G01R 31/3004 324/750.3 |

(Continued)

FOREIGN PATENT DOCUMENTS

| | | |
|---|---|---|
| KR | 10-2004-0099951 | 12/2004 |
| KR | 10-2007-0013813 | 1/2007 |

(Continued)

OTHER PUBLICATIONS

Jeongah Yoon, "A Prognostic Method of Assessing Solder Joint Reliability Based on Digital Signal Characterization", In: 2015 Electronic Components & Technology Conference. May 26, 2015, pp. 2060-2065.

*Primary Examiner* — Jermele M Hollington
*Assistant Examiner* — Temilade S Rhodes-Vivour
(74) *Attorney, Agent, or Firm* — Lex IP Meister, PLLC

(57) ABSTRACT

A method for detecting damage of a solder joint of a printed circuit board of an electronic product by using a device for detecting damage of an electronic product according to the present invention includes: generating a digital signal and applying the digital signal to the solder joint of the printed circuit board; measuring a signal transmitted through the solder joint of the printed circuit board; and determining whether the solder joint of the printed circuit board is damaged using the measured signal. Accordingly, the device for detecting damage of an electronic product according to (Continued)

the present invention can nondestructively examine damage of the electronic product by using the digital signal.

9 Claims, 6 Drawing Sheets

(56) References Cited

U.S. PATENT DOCUMENTS

| | | | | |
|---|---|---|---|---|
| 2007/0046283 | A1* | 3/2007 | Onishi | H05K 3/1233 700/110 |
| 2008/0156990 | A1* | 7/2008 | Ohashi | G01N 21/276 250/341.1 |
| 2009/0058435 | A1* | 3/2009 | Nakamura | G01R 27/14 324/719 |
| 2012/0268153 | A1* | 10/2012 | Nickel | G01R 31/3025 324/754.31 |
| 2013/0015870 | A1* | 1/2013 | Nickel | G01R 1/06772 324/754.03 |

FOREIGN PATENT DOCUMENTS

| | | |
|---|---|---|
| KR | 10-2013-0117276 | 10/2013 |
| KR | 10-2014-0060667 | 5/2014 |
| KR | 10-2015-0022352 | 3/2015 |

* cited by examiner

DEVICE AND METHOD FOR DETECTING DAMAGE OF ELECTRIC PRODUCT USING DIGITAL SIGNAL

TECHNICAL FIELD

The present invention relates to a device and a method for detecting damage of an electronic product using a digital signal.

BACKGROUND ART

In general, an electronic product includes at least one printed circuit board (PCB). Various types of electronic components are mounted on the printed circuit board using interconnects. The robustness of the interconnects needs to be tested to determine whether or not the printed circuit board where the electronic parts are mounted is defective.

The robustness of the interconnects is tested by photographing a reflective image of lattice-pattern light generated from light source using a camera and measuring a 3D shape based on a height of a measurement target such as the printed circuit board using the photographed reflective image.

Meanwhile, the electronic components are mounted on the printed circuit board using solder joint. In this case, the solder joint may be defective due to over-soldering, mis-soldering, or cold soldering of solder coated on a pad of the printed circuit board.

However, in order to test the solder joint of the printed circuit board installed in the electronic product, the printed circuit board needs to be disassembled from the corresponding electronic product. Accordingly, it is difficult to detect damage to the solder joint portion after being assembled to a product.

DISCLOSURE OF THE INVENTION

Technical Problem

The present invention has been made in an effort to provide a device and a method for detecting damage of an electronic product using a digital signal having advantageous of nondestructively detecting the damage of the electronic product.

Technical Solution

A method for detecting damage of a solder joint of a printed circuit board of an electronic product by using a device for detecting damage of an electronic product according to the present invention includes: generating a digital signal and applying the digital signal to the solder joint of the printed circuit board; measuring a signal transmitted through the solder joint of the printed circuit board; and determining whether the solder joint of the printed circuit board is damaged using the measured signal.

The applying the digital signal to the solder joint may include applying an ultra high frequency (UHF) signal of 1 gigahertz or higher.

The measuring a signal may include measuring a jitter value of the signal transmitted through the solder joint.

The determining whether the solder joint of the printed circuit board is damaged may include determining whether the solder joint is damaged by comparing a jitter value in a normal state where the solder joint is not damaged with the jitter value of the measured signal.

The determining whether the solder joint of the printed circuit board is damages may include determining that the solder joint is damaged when the jitter value of the signal transmitted through the solder joint is greater than the jitter value in the normal state.

A device for detecting damage of an electronic product according to the present invention includes: a digital signal generator that generates a digital signal and applies the digital signal to a target object; a measurer that measures a signal transmitted through the target object; and a detector that determines whether or not the target object is damaged by using the measured signal.

The target object may include a solder joint on a printed circuit board of the electronic product.

The digital signal may include an ultra high frequency (UHF) signal of 1 gigahertz or higher.

The measured signal may include a jitter value that includes a phase variation between the digital signal and the signal transmitted through the solder joint.

The detector may determine whether the target object is damaged by comparing a jitter value in a normal state where the target object is not damaged with the jitter value of the measured signal.

The detector may determine that the solder joint is damaged when the jitter value of the signal transmitted through the solder joint is greater than the jitter value in the normal state.

The device may further include at least one switch that applies the digital signal to multiple target objects or measures a signal, wherein the detector may simultaneously examine the multiple target objects by measuring jitter values in solder joints of the multiple target objects.

Advantageous Effects

According to the present invention, since a digital signal is applied to a target object and a jitter value of a measured signal is compared with a jitter value in a normal state, an environment where damage of a solder joint of a printed circuit board of an electronic product can be nondestructively examined is provided.

BEST MODE FOR INVENTION

Figure 1:
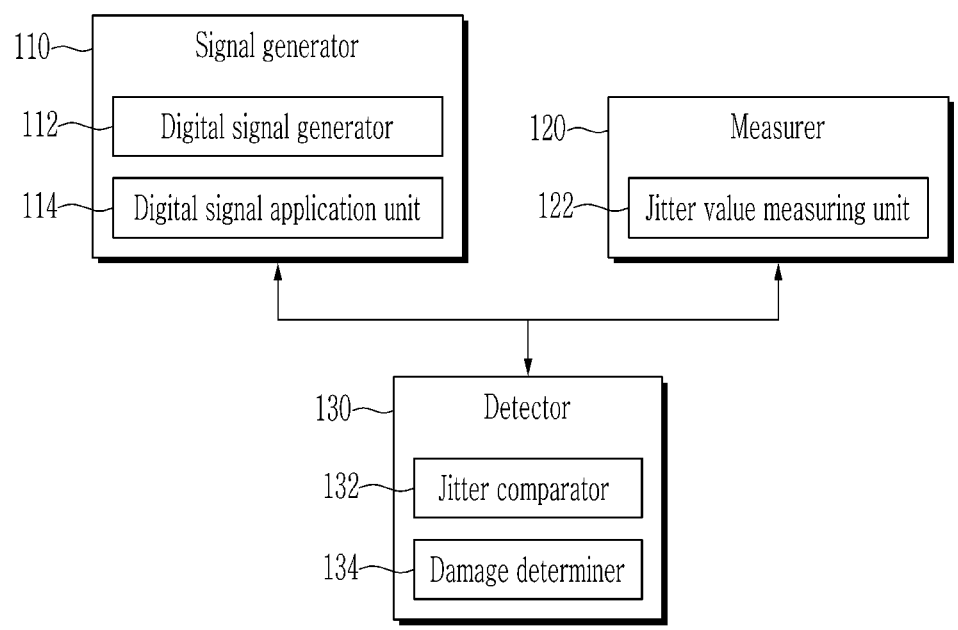
FIG. 1 schematically shows a structure of a device for detecting damage of an electronic product according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, unless explicitly described to the contrary, the word "comprise" and variations such as "comprises" or "comprising" will be understood to imply the inclusion of stated elements but not the exclusion of any other elements.

In addition, the terms "-er", "-or", and "module" described in the specification mean units for processing at least one function and operation, and can be implemented by hardware components or software components and combinations thereof.

Hereinafter, a device for detecting damage of an electronic product and a method for detecting damage of an electronic product using the same according to an exemplary embodiment of the present invention will be described with reference to FIG. 1 to FIG. 6.

FIG. 1 schematically shows a device for detecting damage of an electronic product according to an exemplary embodiment of the present invention. Herein, for description of an exemplary embodiment of the present invention, only essential components of the device for detecting damage of an electronic product are schematically illustrated, but the device is not limited thereto.

Referring to FIG. 1, a device 100 for detecting damage of an electronic product according to an exemplary embodiment of the present invention is a device that detects damage of a solder joint of a printed circuit board (PCB) of the electronic product by using a digital signal. The device 100 for detecting damage of an electronic product according to the exemplary embodiment of the present invention includes a signal generator 110, a measurer 120, and a detector 130.

The signal generator 110 generates a detection signal, and applies the detection signal to a solder joint of the electronic product, which is a target object.

The signal generator 110 according to the exemplary embodiment of the present invention includes a digital signal generator 112 and a digital signal application unit 114. The digital signal generator 112 generates a digital signal, and the digital signal application unit 114 applies the generated digital signal to the target object. Here, the digital signal includes an ultra high frequency (UHF) signal of 1 gigahertz or more.

The measurer 120 measures a signal transmitted through the solder joint, which is the target object. The measurer 120 according to the exemplary embodiment of the present invention includes a jitter value measuring unit 122.

The jitter value measuring unit 122 measures a jitter value of a signal transmitted through the solder joint. Here, the jitter value includes a phase variation between the digital signal and the signal transmitted through the solder joint.

The detector 130 detects whether or not breakage such as a crack occurs in the solder joint by using the measured jitter value.

The detector 130 according to the exemplary embodiment of the present invention includes a jitter value comparator 132 and a damage determiner 134.

The jitter value comparator 132 compares a jitter value in a normal state where the solder joint is not damaged with a jitter value of the signal measured by the jitter value measuring unit 122.

The damage determiner 134 determines whether breakage such as a crack has occurred in the solder joint, which is the target object, by using a comparison result of the jitter values.

To this end, the detector 130 may be implemented with one or more processors executed by a predetermined program, and the predetermined program may be programmed to perform each step of a method for detecting damage of an electronic product according to an exemplary embodiment of the present invention.

Figure 2:
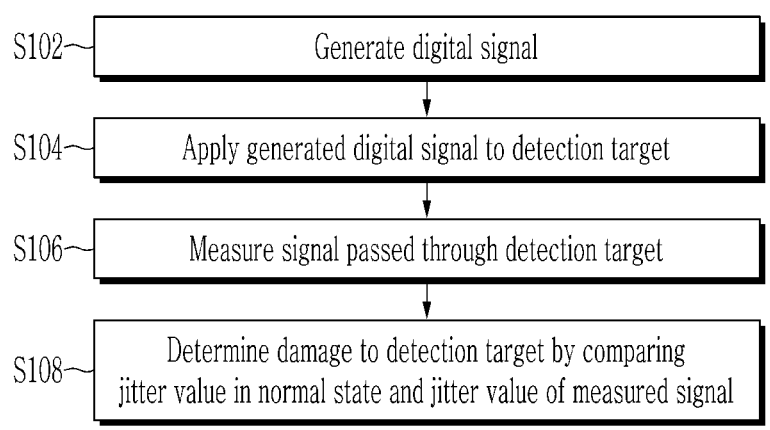
FIG. 2 schematically shows a process for detecting damage of an electronic product by a device for detecting damage of an electronic product according to an exemplary embodiment of the present invention.

FIG. 2 schematically illustrates a process for detecting damage of an electronic product by a device for detecting damage of an electronic product according to an exemplary embodiment of the present invention. The flowchart will be explained with the same reference numerals in conjunction with configurations of FIG. 1 to FIG. 3.

Referring to FIG. 2, the device 100 for detecting damage of an electronic product generates the digital signal and applies the generated digital signal to the solder joint of the PCB of the electronic product, which is the target object at steps S102 and S104 according to the exemplary embodiment of the present invention. Here, the digital signal includes an ultra high frequency (UHF) signal of 1 gigahertz or higher.

In addition, the device 100 measures the signal transmitted through the target object at step S106. The device 100 measures the jitter value of the signal transmitted through the solder joint. Here, the jitter value includes the phase variation between the digital signal and the signal transmitted through the solder joint.

In addition, the device 100 compares the jitter value in the normal state where the target object is not damage with the jitter value of the signal measured from the target object to determine whether or not the target object is damaged at S108.

Figure 3:
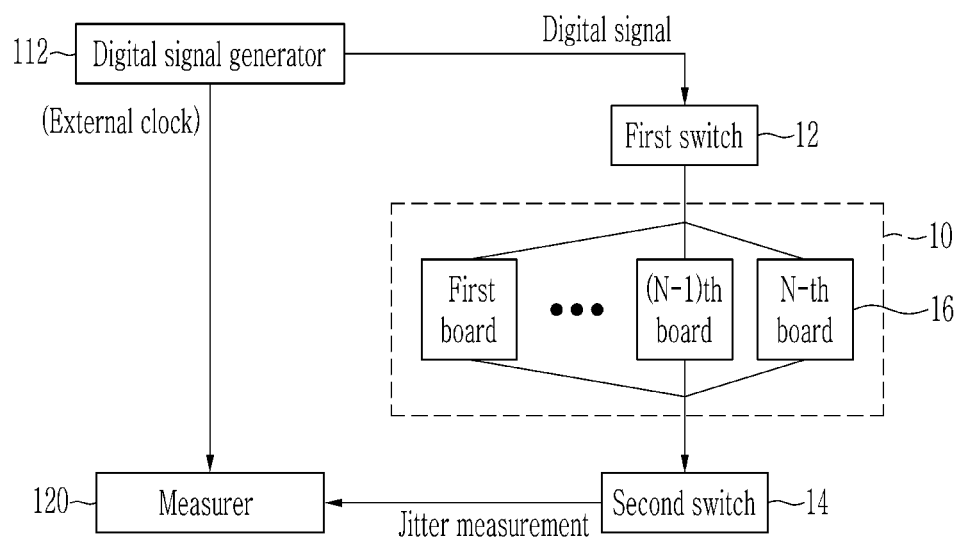
FIG. 3 shows an example in which a device for detecting damage of an electronic product according to an exemplary embodiment of the present invention examines multiple boards.

FIG. 3 shows an example in which a device for detecting damage of an electronic product according to an exemplary embodiment of the present invention examines multiple boards.

Referring to FIG. 3, the device 100 according to the exemplary embodiment of the present invention applies the digital signal of 1 GHz or higher generated by the digital signal generator 112 to the electronic product that includes a solder joint in the normal state without damage.

An oscilloscope, which is the measurer 120 of the device 100, represents the signal transmitted through the solder joint as an eye diagram that includes the jitter value, and the device 100 measures the jitter value in the normal state.

Boards 16 of the electronic products, each including a solder joint to be examined, are mounted in a chamber 10, and the device 100 applies the digital signal to the printed circuit board of each board 16. In this case, the device 100 simultaneously examines multiple printed circuit boards mounted in the multiple boards 16 using a first switch 12 and a second switch 14 that are connected with the chamber 10.

The device 100 also measures the jitter value of the signal that flows through the solder joint using the measurer 120, and compares the measured jitter value with the jitter value in the normal state to determine whether the solder joint of the corresponding PCB is damaged.

Figure 4:
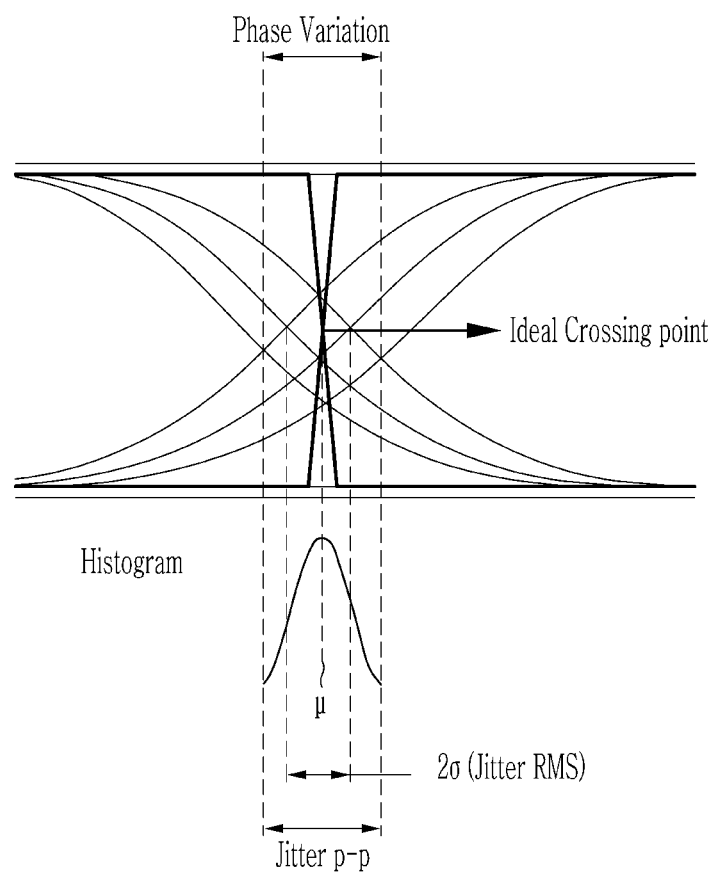
FIG. 4 illustrates defining a jitter value for detecting damage of an electronic product according to an exemplary embodiment of the present invention.

FIG. 4 illustrates defining a jitter value for detecting damage of an electronic product according to an exemplary embodiment of the present invention.

Referring to FIG. 4, according to the exemplary embodiment of the present invention, the jitter for detecting damage of the electronic product is defined by variation from an ideal crossing point at which the digital signal experiences ideal transition, and includes the phase variation of the signal that is actually received. Here, the jitter value includes a jitter amplitude P-P or root mean square (RMS) of the jitter.

The eye diagram includes a diagram illustrated by accumulating the digital signals sampled at regular intervals for every possible bit sequence in an oscilloscope. In addition, it can be observed that signal integrity is deteriorated due to the jitter value that is increased by signal reflection and random noise due to impedance change in a transmission line according to an exemplary embodiment of the present invention.

Figure 5:
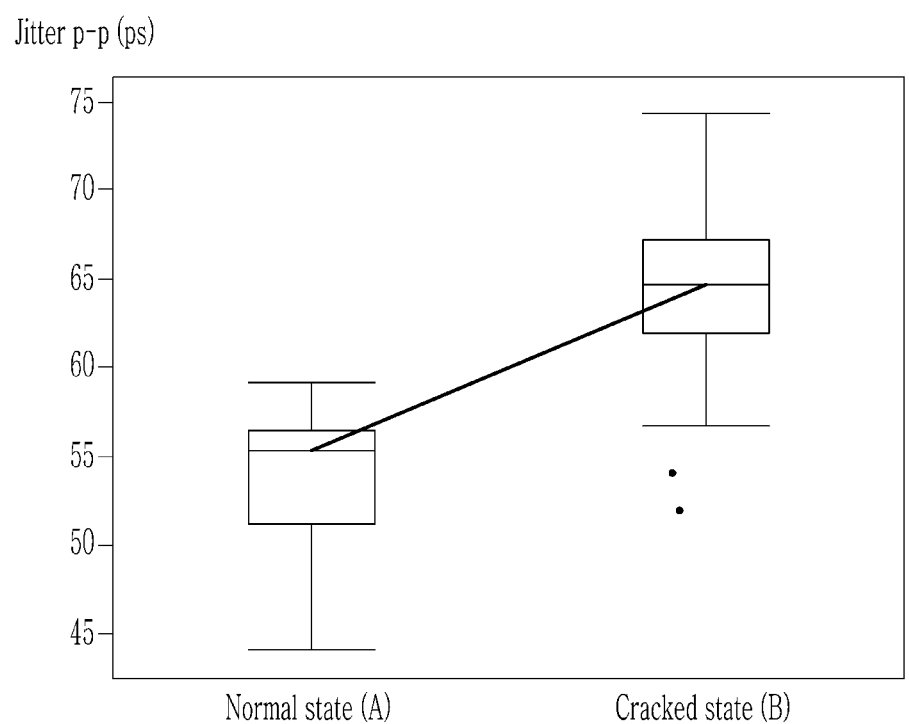
FIG. 5 illustrates comparison of a jitter amplitude p-p in a normal state with that in a cracked state in a solder joint according to an exemplary embodiment of the present invention.
Figure 6:
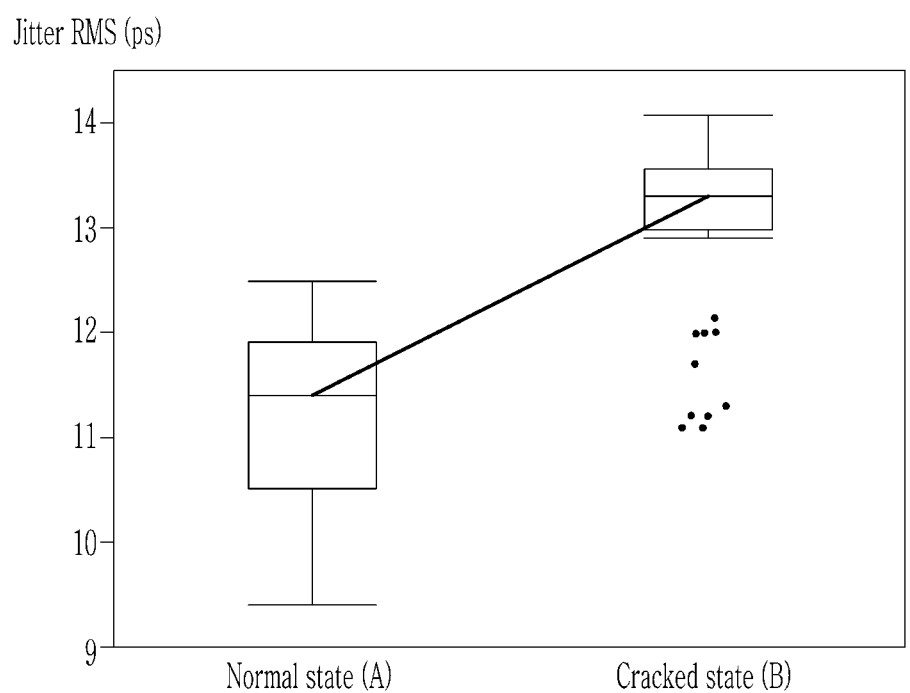
FIG. 6 illustrates comparison of a jitter RMS in a normal state with that in a cracked state in solder joint according to an exemplary embodiment of the present invention.

FIG. 5 illustrates comparison of a jitter amplitude p-p in a normal state with that in a cracked state in a solder joint according to an exemplary embodiment of the present invention, and FIG. 6 illustrates comparison of a jitter RMS in a normal state with that in a cracked state in the solder joint according to an exemplary embodiment of the present invention.

Referring to FIG. 5 and FIG. 6, the device 100 according to the exemplary embodiment of the present invention compares a parameter value in the normal state A with that in the cracked state B. The device 100 detects whether or not the solder joint is cracked due to heat or mechanical load by using a comparison result of the jitter values between in the normal state A and in the cracked state B.

Thus, the device 100 according to the exemplary embodiment of the present invention applies the digital signal to the target object and compares the jitter value of the measured signal with the jitter value in the normal state, thereby provides an environment where damage of the solder joint of the printed circuit board of the electronic product can be nondestructively examined.

The exemplary embodiments of the present invention described above are not implemented only through the device and the method, and may be implemented through a program to execute functions corresponding to the configurations of the exemplary embodiment of the present invention or a recordable medium having the program recorded therein. The recordable medium may be executed in a user terminal as well as a server.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

The invention claimed is:

1. A method for detecting damage of a solder joint of a printed circuit board of an electronic product by using a device for detecting damage of an electronic product, the method comprising:
generating a digital signal and applying the digital signal to the solder joint portion of the printed circuit board;
measuring a signal transmitted through the solder joint of the printed circuit board; and
determining whether the solder joint of the printed circuit board is damaged using the measured signal,
wherein the applying the digital signal to the solder joint comprises applying an ultra high frequency (UHF) signal of 1 gigahertz or higher.

2. The method of claim 1, wherein the measuring a signal comprises measuring a jitter value of the signal transmitted through the solder joint.

3. The method of claim 2, wherein the determining whether the solder joint of the printed circuit board is damaged comprises determining whether the solder joint is damaged by comparing a jitter value in a normal state where the solder joint is not damaged with the jitter value of the measured signal.

4. The method of claim 3, wherein the determining whether the solder joint of the printed circuit board is damaged comprises determining that the solder joint is damaged when the jitter value of the signal transmitted through the solder joint is greater than the jitter value in the normal state.

5. A device for detecting damage of an electronic product, comprising:
a digital signal generator that generates a digital signal and applies the digital signal to a target object;
a measurer that measures a signal transmitted through the target object; and
a detector that determines whether or not the target object is damaged by using the measured signal,
wherein the target object comprises a solder joint on a printed circuit board of the electronic product, and
wherein the digital signal comprises an ultra high frequency (UHF) signal of 1 gigahertz or higher.

6. The device of claim 5, wherein the measured signal comprises a jitter value that includes a phase variation between the digital signal and the signal transmitted through the solder joint.

7. The device of claim 6, wherein the detector determines whether the target object is damaged by comparing a jitter value in a normal state where the target object is not damaged with the jitter value of the measured signal.

8. The device of claim 7, wherein the detector determines that the solder joint is damaged when the jitter value of the signal transmitted through the solder joint is greater than the jitter value in the normal state.

9. A device for detecting damage of an electronic product, comprising:
a digital signal generator that generates a digital signal and applies the digital signal to a target object;
a measurer that measures a signal transmitted through the target object;
a detector that determines whether or not the target object is damaged by using the measured signal; and
at least one switch that applies the digital signal to multiple target objects or measures a signal,
wherein the detector simultaneously examine the multiple target objects by measuring jitter values in solder joints of the multiple target objects.

* * * * *